United States Patent [19]

Tani

[11] Patent Number: 4,624,047

[45] Date of Patent: Nov. 25, 1986

[54] FABRICATION PROCESS FOR A DIELECTRIC ISOLATED COMPLEMENTARY INTEGRATED CIRCUIT

[75] Inventor: Satoru Tani, Aizuwakamatsu, Japan

[73] Assignee: Fujitsu Limited, Kawasaki, Japan

[21] Appl. No.: 659,962

[22] Filed: Oct. 11, 1984

[30] Foreign Application Priority Data

Oct. 12, 1983 [JP] Japan ................... 58-191181

[51] Int. Cl.⁴ ............... H01L 21/76; H01L 21/302; H01L 21/38
[52] U.S. Cl. ........................... 29/576 W; 29/571; 29/578; 29/576 B; 29/580; 148/1.5; 148/175; 148/DIG. 85; 148/DIG. 38; 148/DIG. 135; 357/42; 357/50; 357/54; 357/55; 357/59; 156/654; 156/649
[58] Field of Search ............. 29/571, 576 W, 576 B, 29/578, 580; 148/1.5, 175, 180, 187, DIG. 85, DIG. 135, DIG. 38; 357/42, 44, 47, 49, 50, 54, 55, 59; 156/654, 649

[56] References Cited

U.S. PATENT DOCUMENTS

| | | | |
|---|---|---|---|
| 3,412,295 | 11/1968 | Grebene | 29/576 W |
| 3,412,296 | 11/1968 | Grebene | 29/576 W |
| 3,509,433 | 4/1970 | Schroeder | 148/DIG. 85 X |
| 3,755,012 | 8/1973 | George et al. | 148/175 |
| 3,798,753 | 3/1974 | Camenzind et al. | 148/DIG. 85 X |
| 3,818,583 | 6/1974 | Polata | 148/DIG. 85 X |
| 3,826,699 | 7/1974 | Sawazaki et al. | 29/576 W X |
| 3,876,480 | 4/1975 | Davidsohn et al. | 148/175 X |
| 3,954,522 | 5/1976 | Roberson | 148/187 X |
| 4,255,209 | 3/1981 | Morcom et al. | 29/580 X |
| 4,290,831 | 9/1981 | Ports et al. | 148/DIG. 135 X |
| 4,393,573 | 7/1983 | Kato et al. | 29/576 W X |
| 4,481,707 | 11/1984 | Cunniff | 29/576 W X |

OTHER PUBLICATIONS

Grove, "Physics and Technology of Semiconductor Devices", Fairchild Semiconductor, Palo Alto, Univ. of Cal., Berkeley, 1967, pp. 36–41.

Primary Examiner—Brian E. Hearn
Assistant Examiner—David A. Hey
Attorney, Agent, or Firm—Staas & Halsey

[57] ABSTRACT

A method for fabricating isolated regions for a dielectric isolated complementary integrated circuit which avoids the difficulty of mask alignment and patterning on a deeply etched uneven surface of the substrate by aligning the patterns before etching and thereby forming p-type and n-type islands at the same time. A poly-silicon layer is grown on the surface of the substrate covering the islands and the substrate is removed from its back surface, leaving the islands embedded in the poly-silicon layer which becomes a new substrate.

8 Claims, 16 Drawing Figures

FABRICATION PROCESS FOR A DIELECTRIC ISOLATED COMPLEMENTARY INTEGRATED CIRCUIT

BACKGROUND OF THE INVENTION

1. Field of the Invention

The present invention relates to a fabrication process for a dielectric isolated complementary integrated circuit (IC), and, more particularly, to an improvement in the fabrication process for dielectric isolated regions in which the complementary transistors are fabricated.

2. Description of the Prior Art

Since the first integrated circuit, isolation between circuit elements therein has been a matter of great concern. Air isolation, dielectric isolation and junction isolation have been the main streams of element isolation development, where junction isolation has been the most successful and now is in very wide use. Dielectric isolation, which isolates circuit elements from each other using a dielectric film, such as silicon dioxide ($SiO_2$), has been applied only in limited situations even though it provides the advantages of small stray capacitance and high breakdown voltage. The limited use has been primarily due to the difficulty of the conventional fabrication process for a dielectric isolated device, which requires not only removal of the greater part of a substrate by lapping or polishing, but also a difficult alignment of a resist pattern on a deeply grooved surface of an etched substrate to form the isolation layers. The difficulty of the process results in a decreased yield and increased costs for the IC.

Recently demand for high voltage devices has been increasing because the high voltage ICs are now used widely in electronic equipment, for example, a subscriber line interface circuit (SLIC) in an electronic telephone switching system is required to withstand several hundred volts. In this application, the IC must be a complementary IC, therefore providing both pnp and npn type transistors. For such applications, especially for fabricating complementary IC circuits, the dielectric isolation process has been recently reconsidered.

To clarify the advantages of the present invention over the prior art, a prior art process for fabricating a dielectric isolated complementary IC, as shown in FIG. 1, will be briefly described. FIG. 1 illustrates a partial cross-sectional view of the construction of an exemplary IC including dielectrically isolated complementary transistors. Such an isolation structure is sometimes called an epitaxially passivated integrated circuit (EPIC) and is a well known structure developed during the early stages of IC development (see, for example, U.S. Pat. No. 3,966,577 issued June 29, 1976, by A. K. Hochberg, entitled "Dielectrically Isolated Semiconductor Devices").

In FIG. 1, a pnp transistor is fabricated in a p-type semiconductor region P, and an npn transistor is fabricated in an n-type region N. The transistors are surrounded by a silicon dioxide layer I and a buried layer B and formed in a polysilicon (polycrystalline silicon) substrate.

First a projecting island 2 is fabricated on a p-type silicon substrate 1 as illustrated in FIG. 2. The projection is created by selective etching, where a portion of the substrate where the island 2 should be made is coated with a silicon-nitride ($Si_3N_4$) film (not shown) and uncovered portions are etched away. It is well known that, when a silicon surface of <100> orientation is etched using a potassium hydroxide solution, differences in etching speed for different crystal planes result in an island-like projection 2 as in FIG. 2. This type of anisotropic etching is sometimes called a V-cut. The substrate 1 looks like FIG. 2 after the silicon nitride film covering the island 2 has been removed.

Next, as shown in FIG. 3, except for the island 2, the surface of the substrate 1 is again coated with a silicon nitride film (not shown), and boron is doped into the surface of the island 2 by ion implantation using the silicon nitride film as a mask. Then during annealing of the substrate, the doped surface of the island 2 is converted into a p-type region 3. The surface of the substrate is again heated in a wet ambient environment, and a thick silicon dioxide ($SiO_2$) coating film 4 is grown on the surface of the island 2, as shown in FIG. 3. Finally, the silicon nitride film covering the surface of the substrate 1 is removed and the structure of FIG. 3 results. The above-discussed steps are performed using a conventional photo-lithographic process which is widely used in semiconductor fabrication. Of course there may be many modifications to the process, such as using a silicon dioxide film in the place of the silicon nitride film. The difficulties in such a dielectric isolation process are caused by the level difference between the top of the island 2 and the surface of the substrate 1. For example, the height of the island 2 projecting above the surface of the substrate 1 is approximately 40 micrometers, making mask alignment for patterning difficult, and, in addition, since it is very difficult to deposit a uniformly thick resist on a sharply slanted surface, the lack of uniformity of pattern thickness produced by such deep etching also produces problems.

An n-type semiconductor layer 5 is epitaxially grown over the substrate 1 and the projected island 2, as shown in FIG. 4. At this time, the newly grown n-type epitaxial layer 5 loses its crystalline structure in the portion over the silicon dioxide and has an amorphous structure, and becomes amorphous polycrystalline silicon (poly-silicon) resulting in island portion 2 of the substrate 1 being coated with a poly-silicon 5', while the remainder of the substrate 1 is covered with an n-type single crystal layer 5, as shown in FIG. 4.

After removing the part of the poly-silicon layer projecting above the surface of the n-type epitaxial layer 5, a similar process, as described with respect to FIGS. 2 and 3, is repeated in the n-type layer 5. That is, by using a silicon nitride film as a mask (not shown), the device is selectively etched (V-cut) leaving a new island portion 5, as shown in FIG. 5. During this process, the poly-silicon layer covering the first island 2 is also etched off. However, the silicon dioxide layer 4 is not etched by the etchant for the poly-silicon, and remains over the first island 2, even though not shown in FIG. 5. Using the silicon dioxide layer 4 as a mask, an n-type dopant, such as phosphor or arsenic, is implanted, into the surface of the substrate using a known ion implantation process, and a highly doped n+ buried layer 6 is formed by annealing. Then, the silicon dioxide layer 4 is removed by a hydrofluroic acid bath and the substrate as shown in FIG. 5 results.

Next, as shown in FIG. 6, a silicon dioxide layer 7 about 2 micrometers thick is formed over the surface of the substrate by heating the substrate in oxygen gas or by chemical vapor deposition (CVD). The silicon dioxide layer 7 covering the islands 2 and 5 is used later as the dielectric isolation layer I (see FIG. 1) isolating the semiconductor devices. Then, a poly-silicon layer is deposited over the entire surface of the substrate 1, and, finally, the substrate 1 is lapped off leaving the inverted islands 2 and 5 resulting in the substrate as shown in FIG. 1. The above explanation has been provided while emphasizing the sequence of the process relevant to the present invention. However, the process steps are all conventional and the specific details, such as etching bath temperature and time, have been omitted for the sake of simplicity.

As described above, it is necessary to form the p-type and the n-type islands in sequence, and the distance the islands project above the surface of the substrate is high. Occasionally, the height exceeds several tens of micrometers. Such level differences in the substrate surface cause difficulties in the patterning and etching of the substrate. In order to overcome the problem, conventionally, a photo-resist is applied several times to the non-planar surfaces, and the patterning and etching is also repeated several times. However, such process improvements are still inadequate and the lack of uniformity in the thickness of the photo-resist causes uneven etching. It is also necessary to provide an additional process to remove the projecting portion of the poly-silicon formed on the island 2 by grinding, etching or polishing. Such additional processes decrease the yield and increase the cost of the IC.

As described above, prior art processes do not provide a solution to overcome the etching process difficulties, and, in addition, it is necessary to repeat the process of island making (sequentially create the different conductivity islands) and to dope the surfaces of p-type and n-type islands separately. As a result, the yield of the dielectric isolated complementary IC produced in accordance with the prior art process is not good and the cost is relatively high.

SUMMARY OF THE INVENTION

It is an object of the present invention to provide an improved process for fabricating a dielectric isolated IC, especially for fabricating a complementary IC.

It is another object of the present invention to provide a process for fabricating a region isolated from other parts of the IC by a dielectric material.

It is a further object of the present invention to provide a process which permits the patterning of isolated regions on a planar surface.

It is still another object of the present invention to make the process easy and increase the yield of a dielectric isolated IC.

It is also an object of the present invention to provide a process in which islands of opposite conductivity are created at the same time.

It is another object of the present invention to reduce the number of times a photoresist is applied during fabrication of dielectric isolated regions.

It is a further object of the present invention to reduce the number of process steps necessary for fabricating dielectric isolated regions in a semiconductor substrate.

The above objects are attained by a process including the following steps: a p-type well is formed in an n-type substrate; a part of the surface of the substrate, where p-type and n-type islands are to be formed, is coated with a protective resist film; the substrate is anisotropically etched (V-cut) using the protective film as a mask, forming the p-type and n-type islands at the same time; the surface of each island is selectively doped with respective type dopants, where these highly doped surfaces later become buried layers; the surface of the substrate is coated with an isolation film which later becomes a dielectric isolation film; a poly-silicon layer is grown on the surface of the substrate; the silicon substrate under the poly-silicon layer is lapped off, and the poly-silicon layer becomes a new substrate; and pnp and npn transistors are fabricated in the respective exposed island regions.

The above-discussed steps are an ideal sequence for the process, however, in actual practice, some of the steps cannot be performed as simply set forth above using present state-of-the-art technology. The most serious problem is the masking and patterning process for selectively doping the surfaces of the projecting islands with different ions. A photo-resist mask generally cannot be applied on sharply tapered surfaces, and, as a result, it becomes impossible to selectively and uniformly dope the side walls of each island with a desired dopant. Therefore, the above ideal sequence is modified, to make it possible to perform the process using present state-of-the-art technology. Details of these modifications will become clear from a reading of the following detailed description of the invention in connection with the accompanying drawings. However, if improvements in the application of a photo-resist to sharply slanted surfaces arise, the above ideal sequence would be applicable.

These, together with other objects and advantages, which will be subsequently apparent, reside in the details of construction, as more fully hereinafter described and claimed, reference being had to the accompanying drawings forming a part hereof, wherein like numerals refer to like parts throughout.

DESCRIPTION OF THE PREFERRED EMBODIMENTS

The present invention forms the p-type and n-type islands at the same time, and eliminates the need for many etching steps, to obtain a deep etching, which produce occassional problems. The present invention also avoids the necessity of mask alignment over a surface having large level differences, and maintains the sharpness of the mask and the uniformity of the photolithograph by applying the resist to planar surfaces.

Figure 1:
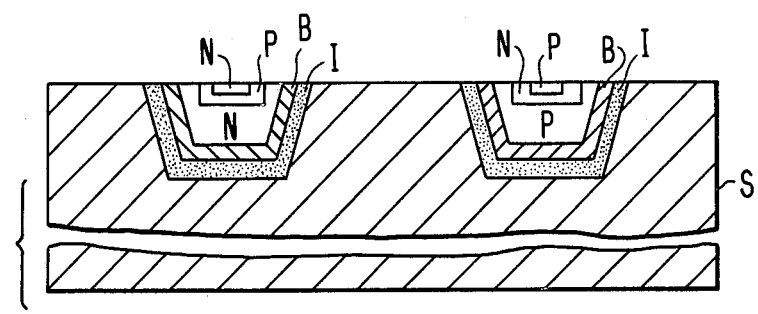
FIG. 1 illustrates the structure of an exemplary dielectric isolated complementary IC produced using a prior art process.
Figure 2:
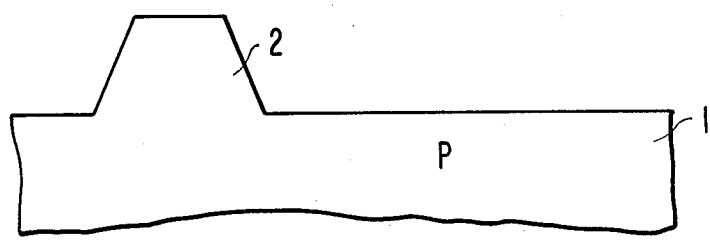
FIG. 2 illustrates the results of a step in the production of the device of FIG. 1 in which a p-type projecting island 2 is fabricated on a p-type substrate 1.
Figure 3:
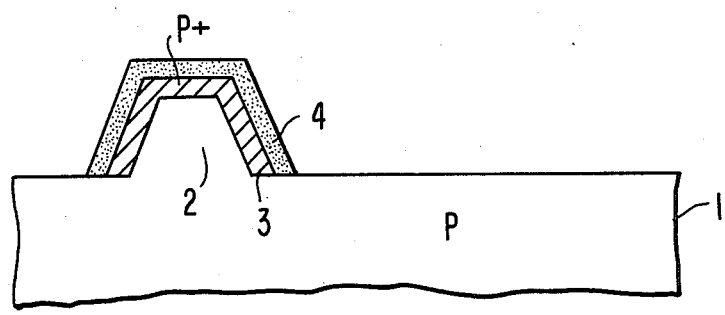
FIG. 3 represents the results of a step in the production of the device of FIG. 1 in which the surface 3 of the island is doped and coated by a silicon dioxide film 4.
Figure 4:
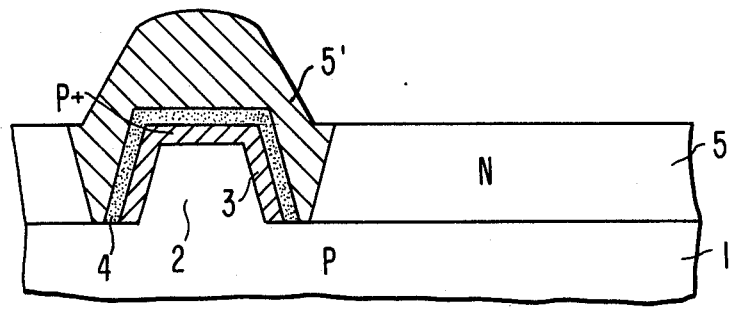
FIG. 4 illustrates the results of a step in which an n-type layer 5 and 5' is grown on the surface of the substrate 1.
Figure 5:
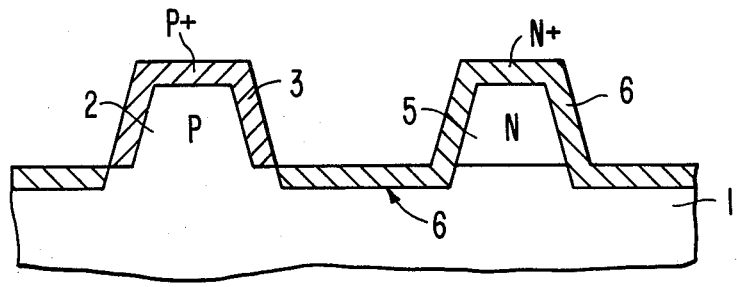
FIG. 5 illustrates the results of a step in which an n-type projecting island 5 is fabricated and its surface 6 is doped.
Figure 6:
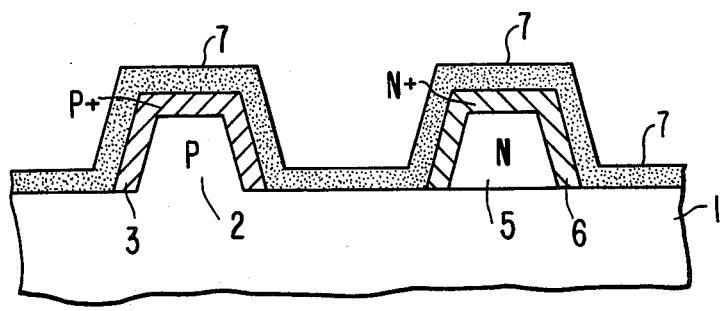
FIG. 6 illustrates the results of a step in the production of the device of FIG. 1 in which the surface of the substrate is coated with a silicon dioxide film 7.
Figure 7:
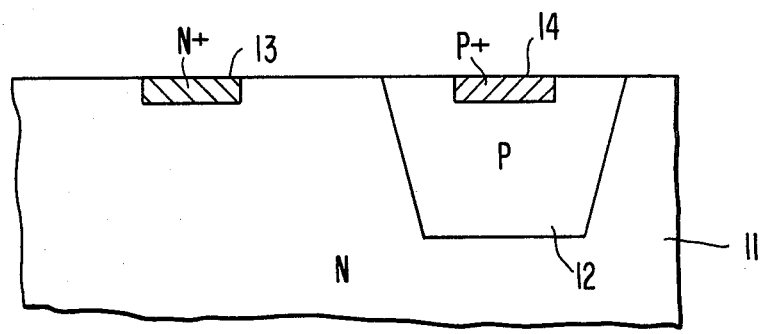
FIG. 7 illustrates a first step in the process of the present invention in which a p-type well 12 is fabricated in an n-type substrate 11, and portions 13 and 14 of the surface of the substrate are doped.

The process according to the present invention starts with a known n-type silicon substrate having a <100> oriented surface. The discussion hereafter will be with respect to an n-type substrate, however, it will be obvious to those of ordinary skill in the art that the process may be modified to start with a p-type substrate. A p-type well 12 is formed in an n-type substrate 11 which has a <100> crystal orientation. On the surface of the substrate 11 where the npn and pnp transistors are to be made, an $n^+$ region 13 and $p^+$ region 14 are fabricated, respectively, on the p-type well and n-type region, as shown in FIG. 7. These highly doped regions 13 and 14 later become part of buried layers in the isolated regions. The highly doped regions 13 and 14 are fabricated by ordinary semiconductor fabrication processes such as photo-lithographic patterning of a photo-resist film or an isolation film followed by ion diffusion or ion implantation.

Figure 8:
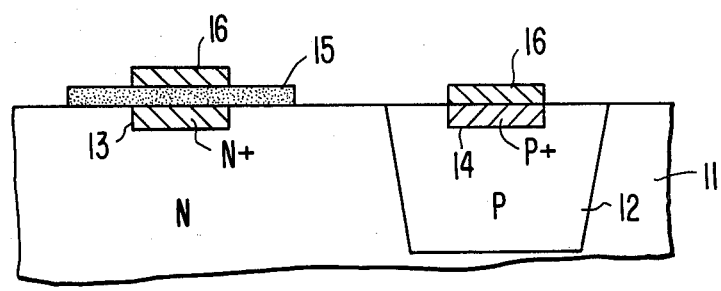
FIG. 8 illustrates a subsequent step in which a portion of the surface of the substrate is coated with a silicon dioxide film 15 and a silicon nitride film 16.

On the surface of the substrate, a silicon dioxide ($SiO_2$) film 15 is formed as a first mask film, and a silicon nitride ($Si_3N_4$) film 16 is formed as a second mask film. The films 15 and 16 are patterned, as shown in FIG. 8, by using an ordinary photo-lithographic process. The second film 16 is the same size as the highly doped regions 13 and 14, and is positioned just over each of the highly doped regions 13 and 14, respectively. The first film 15 is patterned larger than the second film 16 and it extends approximately 5 micrometers beyond the periphery of the second film 16, as shown in FIG. 8.

It should be pointed out that the mask aligning and photo-lighographic etching operations used in the process up to this point are performed on a planar surface, therefore, the resolution of the patterns are not affected by any unevenness of the substrate. In the processes hereinafter, a photolithograph will not be used until the p-type and n-type isolation regions are completed. This is an important feature of the present invention which allows very accurate patterns to be formed.

Figure 9:
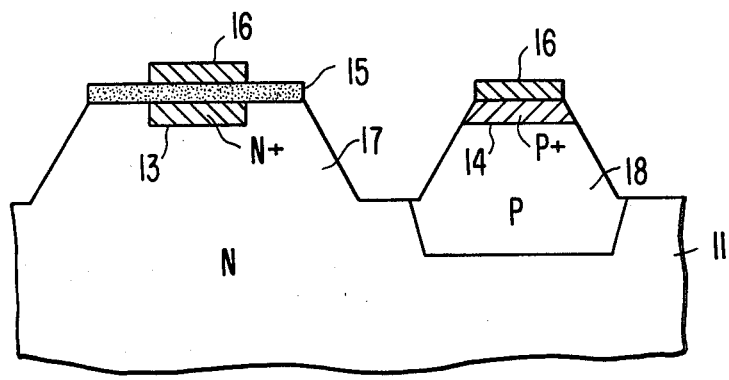
FIG. 9 illustrates another step in the process of the present invention in which the substrate is etched and the p-type 18 and n-type 17 islands are fabricated at the same time.

Next, the part of the substrate not covered by the films 15 and 16 is etched in a potassium hydroxide solution in a known manner and the n-type island 17 and p-type island 18 are fabricated at the same time, as shown in FIG. 9. As mentioned previously, this is another important feature of the present invention. It is well known that a silicon surface with <100> crystal orientation will be anisotropically etched and a surface with <111> orientation, which forms the side walls of the islands, will be etched very little. Thus, trapezoidal islands having the flat films 15 or 16 on the top are formed.

Figure 10:
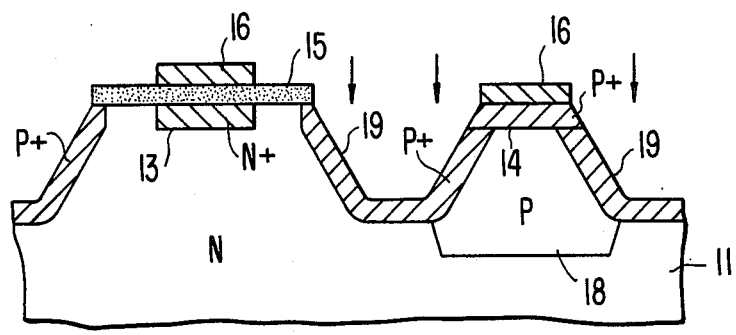
FIG. 10 depicts a step in which the surface 19 of the substrate is doped with a p-type dopant.
Figure 11:
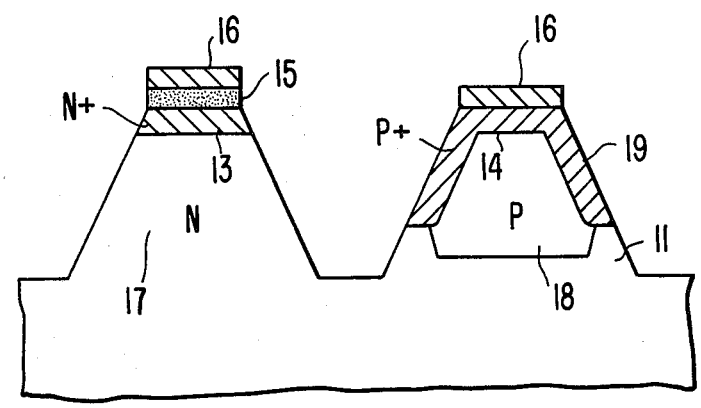
FIG. 11 illustrates a step in which the surface of the substrate is further etched, and the n-type island 17 is reshaped.

After the etching process, as shown in FIG. 10, the surface of the substrate is doped with boron at a dose of about $10^{16}$ using an ion implantation process with acceleration voltage of 70 KeV, for example. The films 15 and 16 are used as a mask. By annealing the substrate in a known manner, the surface of the substrate not covered by films 15 and 16 is converted into a highly doped $p^+$ layer 19. Using a known technique, the silicon dioxide film 15 not covered by the silicon nitride film in FIG. 10 is removed using fluoric acid, and the substrate is again etched with caustic potash using the silicon nitride film 16 as a mask. During the anisotropic etching, the n-type island 12 and the $p^+$ regions 19 on its side wall and the bottom of islands are etched, and the islands are reshaped as shown in FIG. 11.

Figure 12:
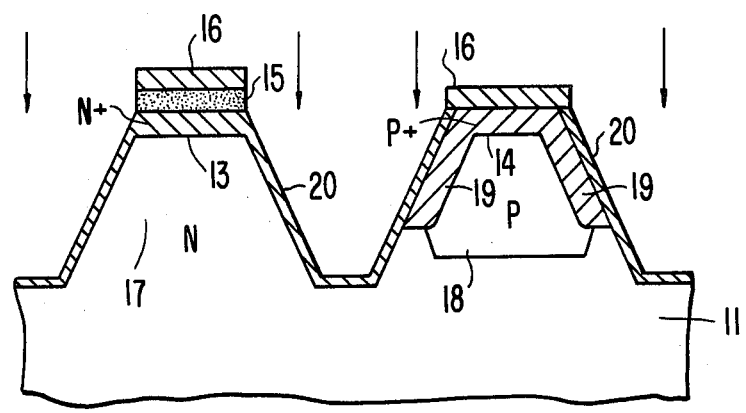
FIG. 12 illustrates a step in which the surface 20 of the substrate is doped with an n-type dopant.

Arsenic is then implanted in the surface of the substrate at a dose of $8 \times 10^{15}$ with an acceleration voltage of 70 KeV, as illustrated in FIG. 12 with the layer 16 used as a mask. During a heat treatment of the surface of the substrate, the side walls of the islands and the substrate are converted into an $n^+$ layer 20. The thickness of the $n^+$ layer 20 is less than the $p^+$ layer 19, due to the difference in the diffusion coefficient of boron and arsenic. The diffusion coefficient of the former is much larger than that of the latter. As a result, the $p^+$ layer 19 remains under the $n^+$ layer 20, as shown in FIG. 12. For example, when the thickness of the $p^+$ layer 19 is 5 micrometers, the thickness of the $n^+$ layer 20 is not more than 2 micrometers. The thickness of $p^+$ region 19 of the p-type island 18 remains at least 3 micrometers which is enough to serve as a buried layer for the p-type region 18.

Figure 13:
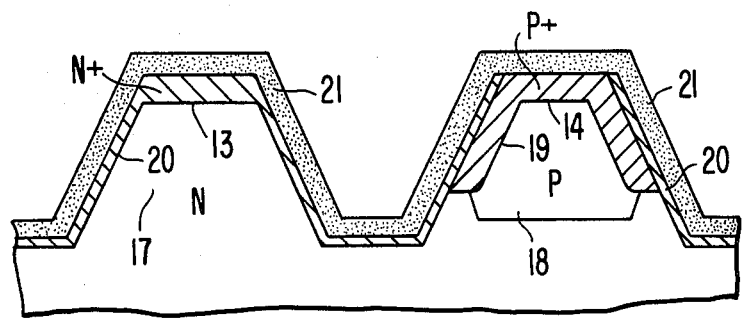
FIG. 13 represents a step in the process of the present invention in which the surface of the substrate is coated with a silicon dioxide film 21.

After removing the silicon nitride film 16 and the silicon dioxide film 15 with a known process, the substrate is treated in an oxidizing gas at 1000° C., and a $SiO_2$ film 21 2.5–3 micrometers thick is formed over the surface of the substrate, as shown in FIG. 13.

Figure 14:
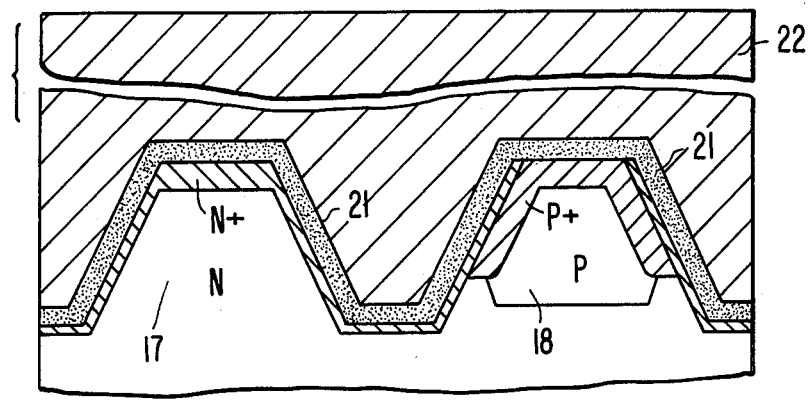
FIG. 14 illustrates a step in which a poly-silicon layer 22 is grown over the surface of the substrate.
Figure 15:
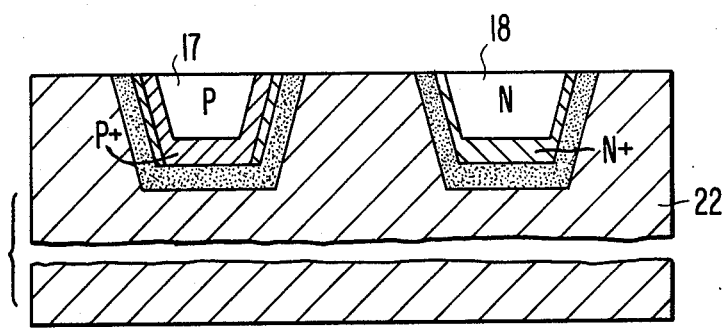
FIG. 15 depicts a step in which the silicon substrate 11 is lapped off and the remaining parts are turned upside down.

Then, as depicted in FIG. 14, a poly-silicon layer 22 several hundred micrometers thick is grown on the surface of the substrate using a known chemical vapor deposition method. Next, almost all of the substrate 11 is lapped or polished or etched off from the back side of the wafer. When the substrate is turned over, it appears as depicted in FIG. 15. As can be seen in FIG. 15, the p-type 17 and n-type 18 isolated regions are in a new poly-silicon substrate 22 and, respectively, surrounded by $p^+$ and $n^+$ type buried layers and isolated from each other by a silicon dioxide layer and poly-silicon material.

Figure 16:
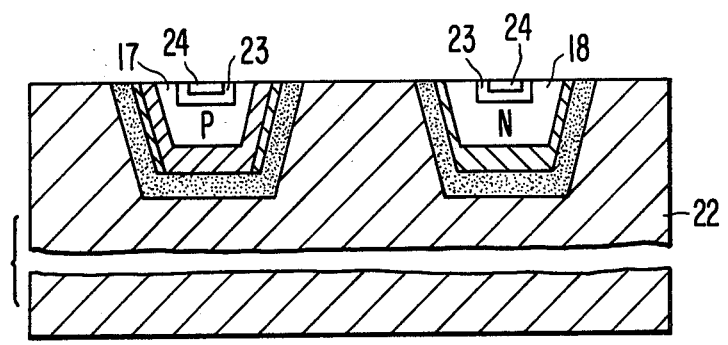
FIG. 16 shows a step in which pnp and npn transistors are fabricated in respective isolation regions.

The process for fabricating the isolated regions is finished, and the substrate in which a dielectric isolated IC can be fabricated is prepared. Since the surface of the substrate is flat, it is easy to fabricate the circuit components of the IC. FIG. 16 illustrates a device in which the bases 23 and emitters 24 are fabricated, thereby fabricating pnp and npn transistors in the p-type and n-type isolated regions. The transistors can be fabricated using conventional semiconductor fabrication technology. After the transistor wiring layers (not shown) are applied and the surface is coated with a passivation film, the dielectric isolated complementary IC is completed.

As disclosed above, according to the process of the present invention, all the patterns including the silicon dioxide film 15 and silicon nitride film 16 used to fabricate the IC are aligned and formed on a flat surface of the substrate. Therefore, the accuracy of the patterns is very high. The deep etching used to form both the isolated islands is done at the same time. These steps improve the packing density of the IC elements and the yield resulting in a greatly decreased cost for the dielectric isolated complementary IC.

The method of the present invention can also include: forming first and second masking layers on separate areas of a substrate; forming a third masking layer covering a portion of the second masking layer; creating a first island by etching using the first mask to define same; doping the sidewalls of the first island with an impurity; removing the third mask; creating a second island by etching as defined by the second mask; doping the walls of the second island with an impurity; forming an isolation layer covering the substrate and the islands; and covering with poly-silicon, removing the substrate and forming transistors in the islands. This process also uses conventional fabrication methods at each step, the details of which would be known to one of ordinary skill in the art. This version of the process preserves the ability to apply all photoresist layers to planar surfaces while reducing the number of processing steps as compared to the prior art.

The discussion herein has been provided with respect to an embodiment for fabricating a dielectric isolated complementary IC. However, the present invention is not limited to a complementary IC and can be applied to any type of semiconductor device having dielectric isolated circuit elements in its substrate. If the method is applied to fabricate a device which includes only one type of transistor, for example, an npn transistor, the process can be simplified, and the process for fabricating the wells or islands of opposite type conductivity in the substrate can be eliminated. The present invention can also be applied to make a substrate which has not only an n-type (or p-type) isolated region (or island) surrounded by n+ (or p+) type buried layer, but also an n-type (or p-type) region (or island) surrounded by p+ (or n+) buried layer.

The process of the present invention can be performed using conventional semiconductor manufacturing processes at each step. Therefore, many modifications can occur in the process and still be within the scope and spirit of the present invention. For example, the ion implantation process can be replaced by an ion diffusion process, and the thermal oxidation process may be replaced by a chemical vapor deposition process, etc. Because conventional processes are used at each step in the method of the present invention details, such as etching bath temperature and time, which would be known to those of ordinary skill in the art, have been omitted to simplify the description presented herein. In addition, as discussed in the Summary of the Invention, if improvements in the resist application process are found, the steps of the process could be rearranged as discussed in the Summary.

The many features and advantages of the invention are apparent from the detailed specification and, thus, it is intended by the appended claims to cover all such features and advantages of the method which fall within the true spirit and scope of the invention. Further, since, as discussed above, numerous modifications and changes will readily occur to those skilled in the art, it is not desired to limit the invention to the exact method illustrated and described, and, accordingly, all suitable modifications and equivalents may be resorted to, falling within the scope of the invention.

I claim:

1. A method for fabricating dielectric isolated regions for a complementary IC starting with a substrate of a first conductivity type, comprising the steps of:
   (a) providing a well of a second conductivity type in the substrate;
   (b) providing a first highly doped region of the first conductivity type in the substrate and a second highly doped region of the second conductivity type in the well;
   (c) covering the first highly doped region and a portion of the substrate with a first film which is larger than the first highly doped region;
   (d) covering the first and second highly doped regions with a second film which is equal in size to the pattern of each highly doped region therebelow, the second film being formed on the first film over the first highly doped region and on the second highly doped region;
   (e) etching the surface of the substrate not covered by the first and second films and producing islands under the first and second films which project above the surface of the substrate;
   (f) doping the surface of the substrate and the exposed portions of the islands with a first impurity having a second conductivity type impurity and a first diffusion coefficient, using the first and second films as a mask;
   (g) etching off the portion of the first film not covered by the second film;
   (h) etching the portion of the substrate which is exposed when the first film is removed instep (g) and reshaping the islands;
   (i) doping the surface of the substrate and the exposed portion of the islands with a second impurity having a first conductivity type impurity and a second diffusion coefficient smaller than the first diffusion coefficient, using the second film as a mask;
   (j) removing the first and second films;
   (k) forming a third film over the surface of the substrate and the islands;
   (l) growing a poly-silicon layer over the surface of the substrate and the islands; and
   (m) removing the substrate leaving the islands in the poly-silicon layer.

2. A method as recited in claim 1, wherein said first film at step (c) extends over the substrate from the periphery of the first highly doped region approximately 5 micrometers.

3. A method as recited in claim 1, wherein the substrate is silicon and said first and second conductivity types are, respectively, n-type and p-type or vice versa.

4. A method as recited in claim 1, wherein the first film is silicon dioxide and the second film is silicon nitride.

5. A method as recited in claim 1, wherein steps (e) and (h) comprise anisotropic etching using a potassium hydroxide solution as an etchant.

6. A method as recited in claim 1, wherein dopants used in the steps (f) and (i) are boron and arsenic, respectively.

7. A method as recited in claim 1, wherein the steps (f) and (i) comprise as ion implantation process.

8. A method as recited in claim 1, wherein step (k) comprises a thermal oxidation process and the third film formed by step (k) is silicon dioxide.

* * * * *

UNITED STATES PATENT AND TRADEMARK OFFICE
CERTIFICATE OF CORRECTION

PATENT NO. : 4,624,047
DATED : November 25, 1986
INVENTOR(S) : Tani

It is certified that error appears in the above-identified patent and that said Letters Patent is hereby corrected as shown below:

Col. 8, line 34, "instep" should be -- in step --.

Signed and Sealed this

Twenty-fourth Day of March, 1987

*Attest:*

DONALD J. QUIGG

*Attesting Officer*  *Commissioner of Patents and Trademarks*